United States Patent
Schrenk

(10) Patent No.: US 7,342,292 B2
(45) Date of Patent: Mar. 11, 2008

(54) CAPACITOR ASSEMBLY HAVING A CONTACT ELECTRODE ENCIRCLING OR ENCLOSING IN RECTANGULAR SHAPE AN EFFECTIVE CAPACITOR AREA

(75) Inventor: Michael Schrenk, Diessen am Ammersee (DE)

(73) Assignee: Infineon Technologies AG (DE)

( * ) Notice: Subject to any disclaimer, the term of this patent is extended or adjusted under 35 U.S.C. 154(b) by 237 days.

(21) Appl. No.: 10/937,745

(22) Filed: Sep. 8, 2004

(65) Prior Publication Data
US 2005/0116277 A1    Jun. 2, 2005

(30) Foreign Application Priority Data
Sep. 9, 2003    (DE) .................................. 103 41 564

(51) Int. Cl.
*H01L 29/00*    (2006.01)
*H01L 29/76*    (2006.01)
(52) U.S. Cl. .................. 257/532; 257/309; 257/534
(58) Field of Classification Search ............... 257/303, 257/306–310, 528, 532, 534, 535; 438/244, 438/253, 255, 387, 396, 398, 665, 964, 957
See application file for complete search history.

(56) References Cited
U.S. PATENT DOCUMENTS
6,090,704 A    7/2000    Kim et al.
6,136,693 A    10/2000   Chan et al.
2001/0020713 A1    9/2001   Yoshitomi et al.
2002/0179951 A1 *  12/2002  Yoshiyama et al. ......... 257/303
2003/0030094 A1 *  2/2003   Lachner ...................... 257/306
2003/0160276 A1    8/2003   Lee et al.

FOREIGN PATENT DOCUMENTS
DE    100 19 839 A1    6/2001
DE    100 08 573 A1    9/2001
DE    101 61 285 A1    7/2003
EP    0 989 615 A2     3/2000

* cited by examiner

*Primary Examiner*—Hung Vu
(74) *Attorney, Agent, or Firm*—Dickstein, Shapiro, LLP.

(57) ABSTRACT

A capacitor assembly has a substrate, a first conductive auxiliary layer on the substrate, a capacitor dielectric, a second conductive auxiliary layer and a contact electrode. Thereby the first conductive auxiliary layer is connected to the capacitor dielectric within a first boundary area and the second conductive auxiliary layer is connected to the capacitor dielectric within a second boundary area. Thereby, an effective capacitor area is present where the first boundary area and the second boundary area overlap across the capacitor dielectric. The contact electrode is connected to the first conductive auxiliary layer in a contacting area, wherein the contacting area is disposed on a surface of the first conductive auxiliary layer opposite to the first boundary area and overlaps the effective capacitor area partly or not at all, so that at least part of the first conductive auxiliary layer within the effective capacitor area is adjacent to the substrate or not to the contact electrode.

7 Claims, 6 Drawing Sheets

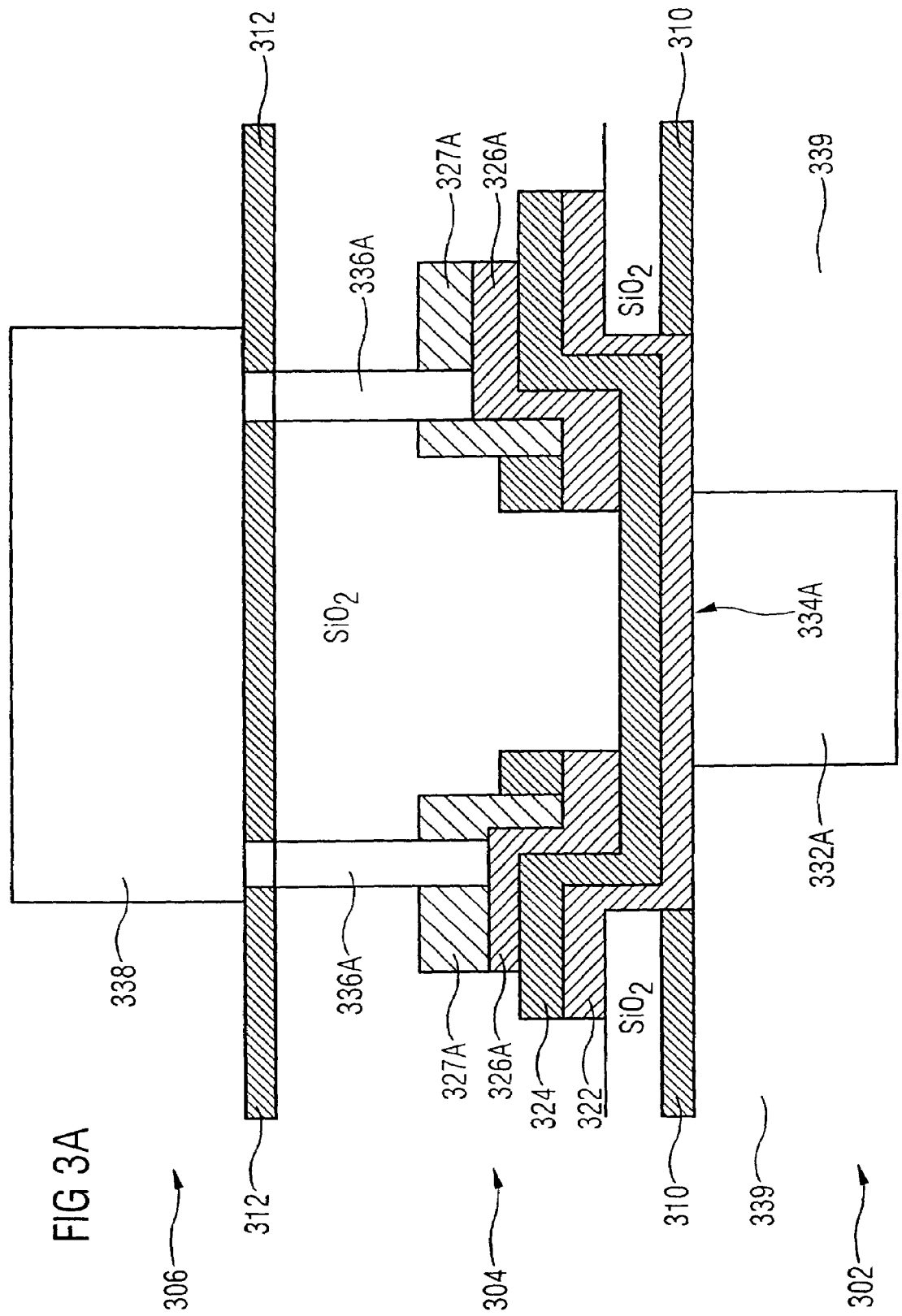

CAPACITOR ASSEMBLY HAVING A CONTACT ELECTRODE ENCIRCLING OR ENCLOSING IN RECTANGULAR SHAPE AN EFFECTIVE CAPACITOR AREA

CROSS-REFERENCE TO RELATED APPLICATION

This application claims priority from German Patent Application No. 10341564.5, which was filed on Sep. 9, 2003, and is incorporated herein by reference in its entirety.

BACKGROUND OF THE INVENTION

1. Field of the Invention

The present invention relates to a capacitor assembly and particularly to an MIM capacitor for integration into an integrated circuit, as well as a method for producing the capacitor assembly.

2. Description of the Related Art

Integrated circuits have capacitors as passive devices. Particularly high frequency circuits in BIPOLAR, BICMOS and CMOS technologies require integrated capacitors with a high specific capacitance at a high voltage linearity, with a precise capacitance value and with low parasitic capacitances. Conventionally, MOS and MIS capacitors, as well as MIM (MIM=Metal Isolator Metal) capacitors are used therefore. Conventional MOS and MIS capacitors, respectively, have, as a disadvantageous property a strong voltage dependency due to voltage-induced space charge regions as well as high parasitic capacitances as a result of a low distance of the capacitor assembly to a substrate whereon the capacitor assembly is disposed.

These problems can be avoided by using MIM capacitors. In integrated circuits, which have a multilayer metallization, MIM capacitors are possibly integrated without changing or influencing the adjacent metal traces. Compared to MOS and MIS capacitors, however, they have a significantly larger distance from the substrate.

DE 101 61 285 A1 presents already a concept, which is suitable for an integration of an MIM capacitor into a Cu Damascene technology. Thereby, the MIM capacitors can also have thin dielectric layers.

An MIM capacitor according to the prior art is illustrated in FIG. 5. A capacitor assembly is shown, which extends across three sheets 502, 504, 506 of an integrated circuit. The lower sheet 502 is separated from the middle sheet 504 by a separation layer 510, and the middle sheet 504 is separated from the upper sheet 506 by a separation layer 512. The separation layers 510, 512 are non-conductive diffusion barriers, such as of $Si_3N_4$.

In the following, the construction of the MIM capacitor assembly is described in Cu Dual Damascene architecture from bottom to top. The capacitor assembly has a lower electrode 522. The lower electrode 522 designed as a solid Cu plate is part of a conductive trace in the lower sheet 502. A conductive barrier layer 524, for example of TaN or TiN can be deposited on the lower electrode 522. The barrier layer 525 is disposed in the middle sheet 504. To connect the barrier layer 524 to the lower electrode 522, the separation layer 510 has an interruption. A dielectric layer 526 is disposed on the lower barrier layer 524, and directly on the lower electrode 522, respectively, when the lower barrier layer 524 is not present. A dielectric 526 consists, for example, of $Si_3N_4$, $Ta_2O_5$ or $Al_2O_3$. An upper electrode 528 is disposed on the dielectric 526, that has generally a sheet structure (not shown) consisting of conductive barriers and possibly a metallic layer arranged between them. An etch stop layer 530 is deposited on the upper electrode 528. The upper electrode 528 is electrically conductively connected through a via hole 534 to a conductive trace 536 which is disposed in the upper sheet 506. The whole capacitor assembly is embedded in sheets 502, 504, 506 in intermediate sheet dielectrics (not shown). When producing the structure shown in FIG. 5, the layer 510 is deposited on the lower sheet 502 consisting, for example, of an isolating layer or another suitable substrate, and an $SiO_2$ layer is deposited on the same.

This layer sequence will then be structured and processed to form a window opening or recess in the layer sequence. Then, the layers 524, 526, 528, 530 are deposited and structured to obtain the structure shown in FIG. 5. An $SiO_2$ layer is deposited on the structure formed in that way, the layer 510 is deposited thereon and the via hole 534 extends through the same.

It has turned out that with such a structure, capacitors with high quality requirements can be realized. The high quality results mainly from a low series resistance, which results mainly from the fact that the first electrode is integrated in the conductive trace level.

Integrated circuits often require small capacitances with high quality, such as for RF applications like filters, mixed signals or switches, but also within the same chip capacitances with a high total capacitance but lower quality requirements. Small capacitances can be produced according to the prior art. Capacitances with a large total capacitance, such as coupling capacitances, require, however, a high specific capacitance, which can be obtained by a large capacitance area and/or a thin dielectric.

This is problematic, since the dielectric of a capacitor arrangement according to the prior art has a relatively high defect density. The lower Cu electrode mainly causes the high number of defects. The lower electrode is heated during the production process. A heavy metal, such as copper, has a high diffusion constant, so that a diffusion of copper atoms into the adjacent dielectric occurs with the arising process temperatures. An impurity of the dielectric by Cu diffusion can lead to leaking currents up to short-circuits. A further disadvantage are roughnesses on the Cu surface, which are caused by Cu hillocks as well as scratches, and which lead to electronic field peaks and thus to a reduced electrical strength or also to leaking currents up to short-circuits. These negative effects stand in the way of the requirements of a large total capacitance, namely a thin dielectric as well as an increased capacitor area.

As a result of the mentioned effects, the quality of the capacitor assembly is reduced, which shows in a lower yield and a shorter life span, respectively. The reduced quality as well as the increased rejection rate results in increased production and follow-up costs.

SUMMARY OF THE INVENTION

It is an object of the present invention to provide a cost-effective high-quality and flexible capacitor assembly.

In accordance with a first aspect, the present invention provides a capacitor assembly, having a substrate; a first conductive auxiliary layer on the substrate; a capacitor dielectric, which is connected to the first conductive auxiliary layer within a first boundary area between the capacitor dielectric and the first conductive auxiliary layer; a second conductive auxiliary layer which is connected to the capacitor dielectric within a second boundary area between the capacitor dielectric and the first conductive auxiliary layer, wherein an effective capacitor area is present where the first boundary area and the second boundary area overlap the dielectric; and a contact electrode for contacting the first conductive auxiliary layer in a contacting area, wherein the contacting area is disposed on a surface of the first conductive auxiliary layer opposing the first boundary area and overlaps with the effective capacitor area only partly or not at all, so that at least part of the first conductive auxiliary layer, which is within the effective capacitor area, is adjacent to the substrate or not adjacent to the contact electrode.

In accordance with a second aspect, the present invention provides a method for generating a capacitor assembly, comprising: a) providing a substrate, a first conductive auxiliary layer on the substrate, a capacitor dielectric which is connected to the first conductive auxiliary layer within a first boundary area between the capacitor dielectric and the first conductive auxiliary layer, and a second conductive auxiliary layer which is connected to the capacitor dielectric within a second boundary area between the capacitor dielectric and the second conductive auxiliary layer, so that an effective capacitor area is present where the first boundary area and the second boundary area overlap; and b) contacting the first conductive auxiliary layer with a contact electrode in a contacting area, so that the contacting area is disposed on a surface of the first conductive auxiliary layer opposite the first boundary area, and overlaps the effective capacitor area at most partly or not, so that at least part of the first conductive auxiliary layer within the effective capacitor area is adjacent to the substrate or not to the contact electrode.

The invention is based on the knowledge that a capacitor assembly, where a contacting area of a contact electrode overlaps with the first conductive auxiliary layer with the effective capacitor area at most partly or not at all, has only a low or even negligible defect density.

According to the present invention, the capacitor assembly has a capacitor dielectric, which is connected to the first conductive auxiliary layer that forms the first electrode. Within the effective capacitor area, the capacitor dielectric is fully, or merely apart from edge regions where the contact area overlaps with the effective capacitor area, protected from spurious effects and impurities by the contact electrode.

The particular advantage of the present invention is that a high-quality capacitor is provided which offers a flexible application spectrum due to a low defect density. Due to the extended application opportunity, as well as the high production yield and long life span resulting from the high quality, the capacitor assembly provides a significant cost advantage compared to prior art.

According to a preferred embodiment of a capacitor assembly, a first conductive auxiliary layer is a barrier layer and a contact electrode of metal. The contact electrode encircles an effective capacitor area.

BRIEF DESCRIPTION OF THE DRAWINGS

These and other objects and features of the present invention will become clear from the following description taken in conjunction with the accompanying drawings, in which:

FIG. 3a is a modification of the embodiment shown in FIG. 3;

DESCRIPTION OF THE PREFERRED EMBODIMENTS

Figure 1:
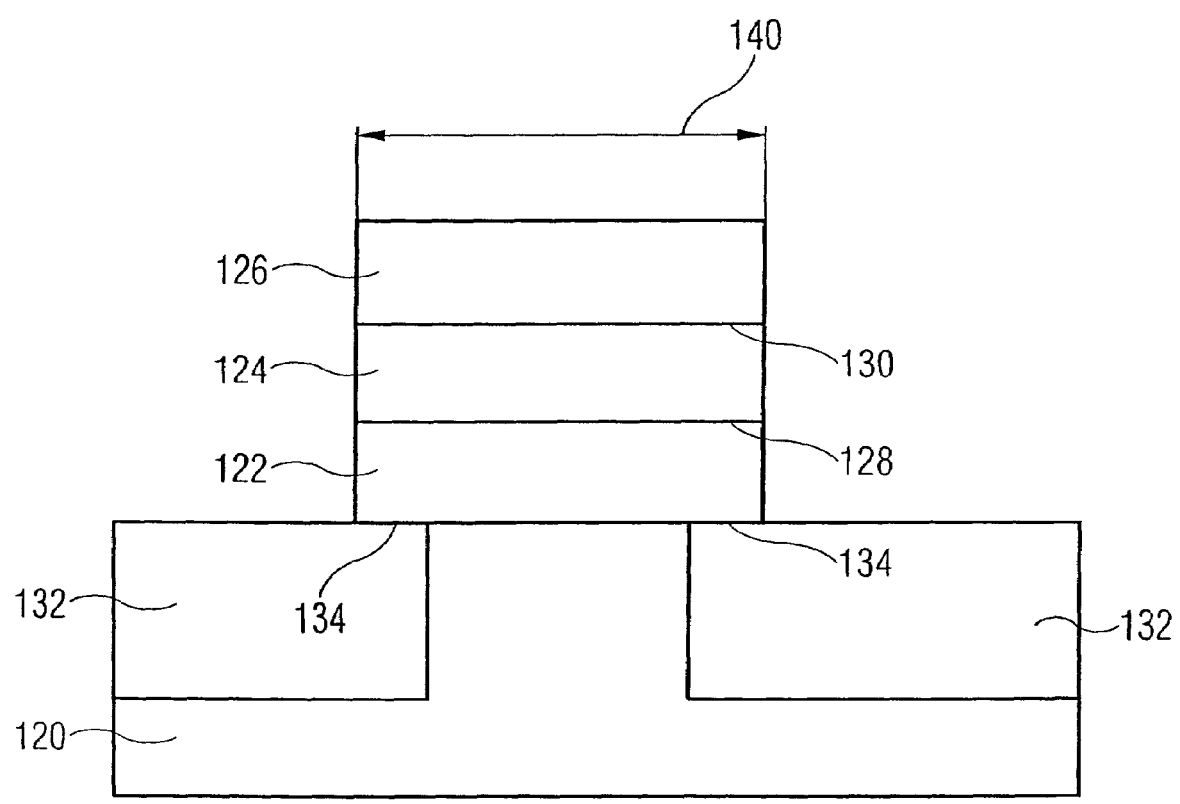
FIG. 1 is a schematic representation of a cross-section of a capacitor assembly according to the present invention.

FIG. 1 shows a schematic cross-section representation through a capacitor assembly according to the present invention. The capacitor assembly is constructed on an isolation layer or another suitable substrate 120. A first conductive auxiliary layer 122 is disposed on the substrate 120. A capacitor dielectric 124 is disposed on the first conductive auxiliary layer 122 and a second conductive auxiliary layer 126 on the same. The first conductive auxiliary layer 122, preferably a barrier layer, and the capacitor dielectric 124 are connected to one another within a first boundary area 128 between the capacitor dielectric 124 and the first conductive auxiliary layer 122. Also, the second conductive auxiliary layer 126 is connected to the capacitor dielectric 124 within a second boundary area 130 between the capacitor dielectric 124 and the second conductive auxiliary layer 126. The first conductive auxiliary layer 122 forms a first conductive electrode and the second conductive auxiliary layer 126 a second conductive auxiliary layer of the capacitor assembly. The first electrode 122 is electrically isolated against the second conductive auxiliary layer 126 through the capacitor dielectric 124. The first conductive auxiliary layer 122 is connected to a contact electrode 132. The contact electrode 132 is preferably formed ring-shaped. Here, it should be noted that the term "ring-shaped" encloses all structures, which are not solid in an area within a peripheral range. According to preferred embodiments, these structures are annularly ring-shaped, square, rectangular, polygonal, etc.

The capacitor assembly has an effective capacitor area 140. The effective capacitor area 140 is designed by an overlapping of the first boundary area 128 and the second boundary area 130 and runs between the first conductive auxiliary layer 122 and the second conductive auxiliary layer 126 through the whole capacitor assembly.

The contact electrode and the contact terminal, respectively, 132 are connected to the first conductive auxiliary layer 122 on one side which is opposite to the first boundary area 128 of the first conductive auxiliary layer 122. The electrode 132 is disposed such that the contacting area 134 and the effective capacitor area 140 overlap partly or not. In this embodiment, the effective capacitor area 140 partly overlaps with the contacting area 134.

Figure 2A:
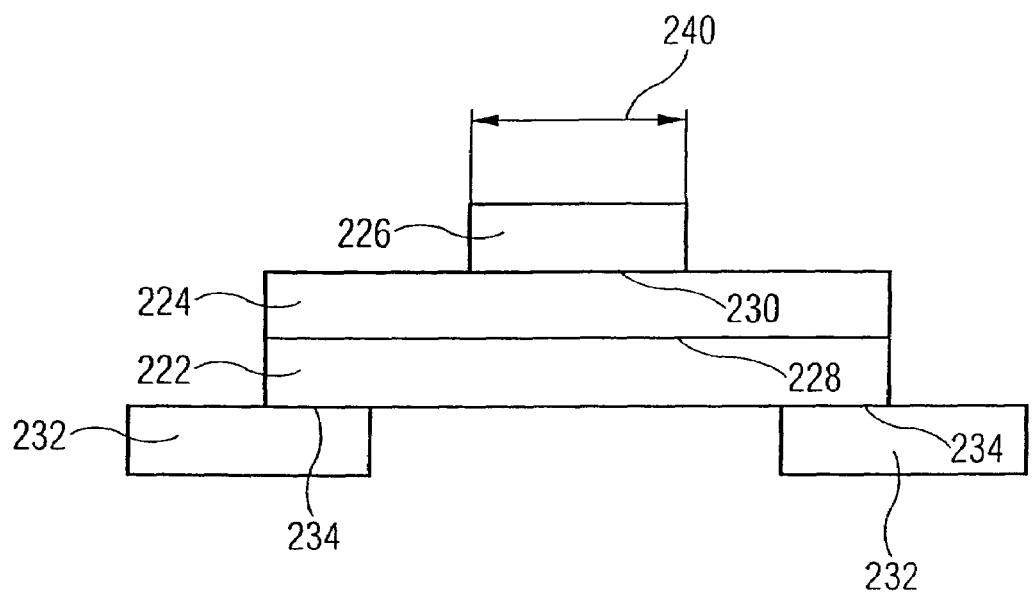
FIGS. 2a-2b are schematic representations of a cross-section of the capacitor assembly according to the present invention for illustrating an effective capacitor area.
Figure 2B:
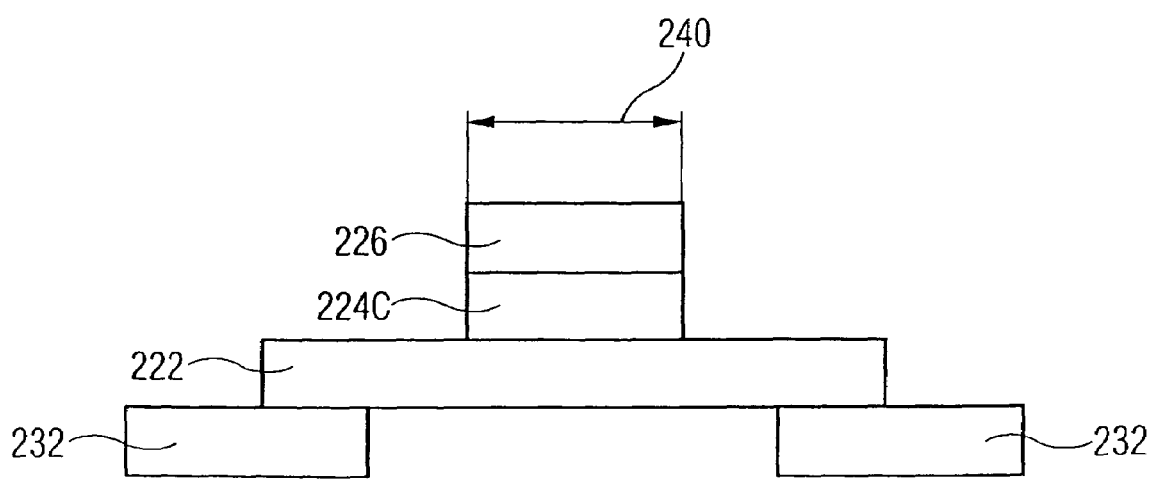

FIGS. 2a and 2b serve for illustrating the definition of the effective capacitor area. Schematical cross-sectional representations of a capacitor assembly according to the present invention disposed on a substrate (not shown) are shown.

FIG. 2a shows a capacitor assembly consisting of a first conductive auxiliary layer 222, a capacitor dielectric 224 as well as a second conductive auxiliary layer 226. Corresponding to the arrangement shown in FIG. 1, the first conductive auxiliary layer 222 is connected to the capacitor dielectric 224 within a first boundary area 228 between the capacitor dielectric 224 and the first conductive auxiliary layer 222. Also, the second conductive auxiliary layer 226 is connected to the capacitor dielectric 224 within a second boundary area 230 between the capacitor dielectric 224 and the second conductive auxiliary layer 226. Also, an electrode 232 is shown, which is connected to the first conductive auxiliary layer 222 within a contacting area 234.

An effective capacitor area 240 is again defined by the area where the first and second boundary areas 228, 230 overlap. In this embodiment, the second conductive auxiliary layer 226 has a smaller spatial extension than the first conductive auxiliary layer 222 as well as the capacitor dielectric 224. The effective capacitor area 240 is thus limited by the second boundary area 230, within which the second conductive auxiliary layer 226 is connected to the capacitor dielectric 224. In this embodiment, the contact electrode 232 is disposed outside the effective capacitor area 240. There is no overlapping of the contacting area 234 with the effective capacitor area 240.

The structure mentioned in FIG. 2a can also be mirrored, i.e. the layer sequence in FIG. 2a can be turned around, so that starting from a support the layers 226, 224, 222, 232 extend towards the top. Further, additionally a contacting of the second conductive auxiliary layer can be provided which is disposed outside the effective capacitor area according to the first contact electrode, such as in the form of a further ring-shaped Cu structure.

FIG. 2b shows a further embodiment of a capacitor assembly according to FIG. 2a. Contrary to FIG. 2a, FIG. 2b shows a capacitor dielectric 224c, which has the same spatial extension as the second conductive auxiliary layer 226. Accordingly, the effective capacitor area 240 is limited by the spatial extension of the conductive auxiliary layer with the smaller dimension, in the illustrated embodiment the second conductive auxiliary layer 226.

Figure 3:
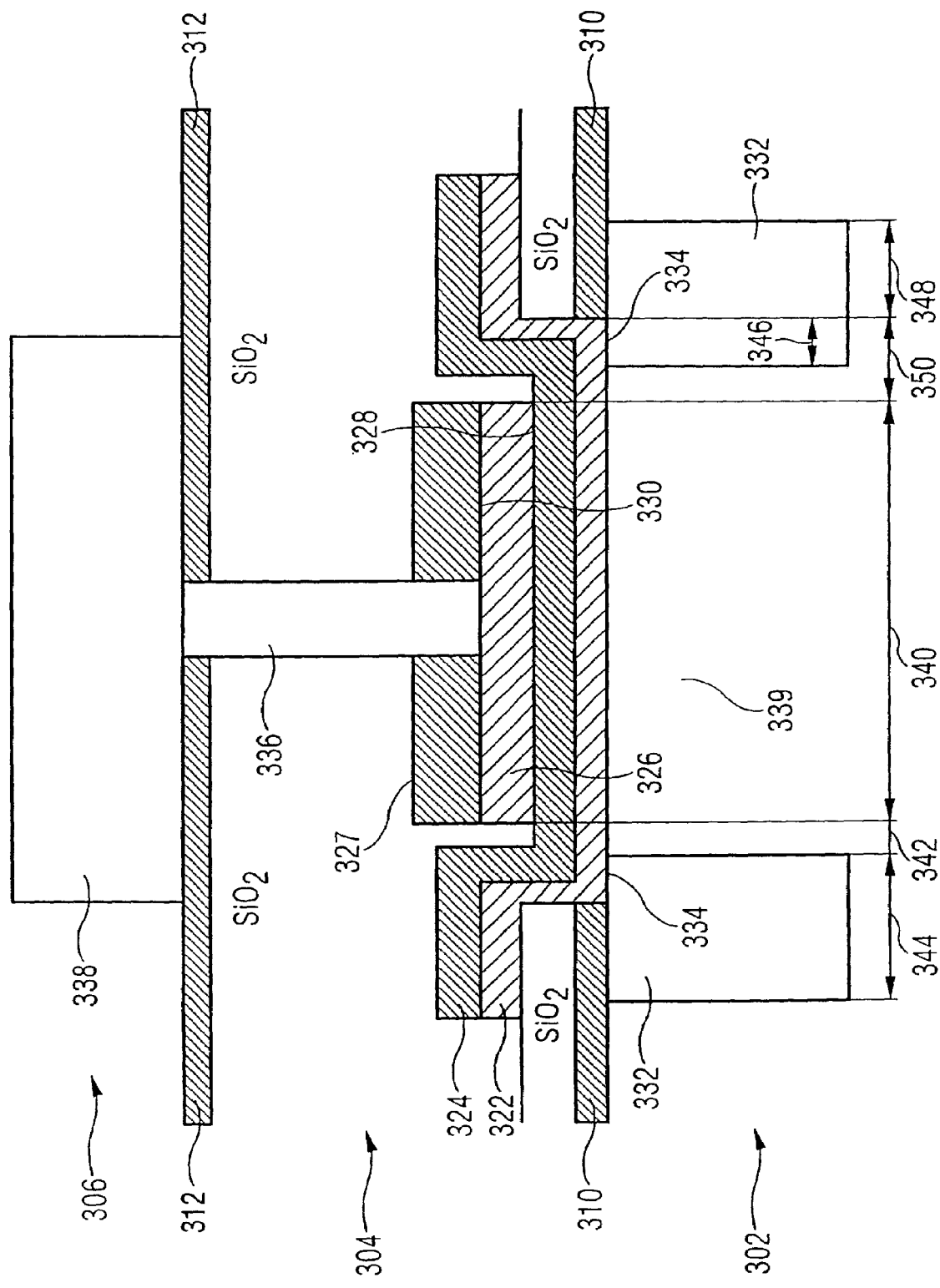
FIG. 3 is a schematic representation of a capacitor assembly according to a preferred embodiment.

FIG. 3 shows a schematic cross-sectional representation of a capacitor assembly according to a preferred embodiment of the present invention. The capacitor assembly is part of an integrated circuit, which has a multilayer metallization. A lower sheet 302, a middle sheet 304 as well as an upper sheet 306 are shown. A separation layer 310 of $Si_3N_1$ is disposed between the lower sheet 302 and the middle sheet 304. Also, a separation layer 312 is disposed between the middle sheet 304 and the upper sheet 306. A first conductive auxiliary layer 322, which forms a lower electrode and a barrier to the copper, respectively, is disposed in a recess of the separation layer 310 and extends into the middle sheet 304. A capacitor dielectric 324 is disposed on the first conductive auxiliary layer 322. A second conductive auxiliary layer 326, which forms an upper electrode, is disposed on the capacitor dielectric 324. The second conductive auxiliary layer 326 is covered by an etch stop layer 327. The outer surfaces of the capacitor dielectric 324, the second conductive auxiliary layer 326 as well as the etch stop layer 326 can be encased by a further protective layer (not shown). When producing the structure shown in FIG. 3, the layer 310 is deposited on the lower sheet 302, such as an isolating layer or another suitable substrate, and on the same an $SiO_2$ layer is deposited. This layer sequence is then structured and processed to form a window opening or recess (interruption) in the layer sequence. Then, the layers 322, 324, 326 and 327 are deposited and structured to obtain the structure shown in FIG. 3. The $SiO_2$ layer is deposited on the structure formed that way, the layer 312 is disposed thereon and the via hole 336 extends through the same.

The first conductive auxiliary layer 322 is connected to the capacitor dielectric 324 within a first boundary area 328 between the capacitor dielectric 324 and the first conductive auxiliary layer 332. Accordingly, the second conductive auxiliary layer 326 is connected to the capacitor dielectric 324 within a second boundary area 330 between the capacitor dielectric 324 and the second conductive auxiliary layer 326.

The first conductive auxiliary layer 322 is connected to a lower contact electrode 332. The contact electrode is preferably formed ring-shaped and is connected to the first conductive auxiliary layer 322 in a contacting area 334. In this embodiment, the second conductive auxiliary layer 326 is connected through a via hole 336 to a conductive trace 338 which is disposed in the upper sheet 306.

The contact electrode 332 is preferably made of Cu and is part of a conductive trace (not shown) or connected to one. The contact electrode 332 establishes an electric connection to the first conductive auxiliary layer 322 and is electrically connected to the same within the contacting area 334. The contact electrode 332 is embedded in a substrate (e.g. $SiO_2$) 339, whereon also the first conductive auxiliary layer 322 as well as the separation layer 310 is disposed. The first conductive auxiliary layer 322 consists preferably of TaN or TiN. The capacitor dielectric 324 consists preferably of $Si_3N_4$, $Ta_2O_5$, $HFO_2$ or $Al_2O_3$. The second conductive auxiliary layer 326 consists preferably also of TaN or Tin. The via hole 336 and the conductive trace 338 are preferably made of Cu.

In this embodiment, both the first conductive auxiliary layer 322 and the second conductive auxiliary layer 326 are made of a material that forms a barrier layer for diffusing atoms of the contact electrode 332. The contact electrode 332 as well as the via hole 336 and the conductive trace 338 are made of a metal that ensures the highest possible quality of the capacitor assembly due to its good conductivity.

The overlapping area of the first and second boundary area 328, 330 defines an effective capacitor area 340. Since the second conductive auxiliary layer 326 forming the upper electrode is within the recess of the separation layer 310, spurious edge effects at the edges of the effective capacitor area 340 are avoided.

The contact electrode 332 is disposed outside the effective capacitor area 340. This means that the effective capacitor area 340 and the contacting area 334 do not overlap. This has the specific advantage that copper atoms from the electrode 332, which diffuse through the first conductive auxiliary layer 322 into the capacitor dielectric 324 during the production process of the capacitor assembly, are outside the effective capacitor area 340. In that way, a short-circuit between the first conductive auxiliary layer 322 and the second conductive auxiliary layer 326 is avoided. It is a further advantage that electric field peaks due to roughnesses generated by Cu hillocks between the Cu contact electrode 332 and the first conductive auxiliary layer 322 have no spurious effect on the effective capacitor area 340 and thus the reliability increases.

As an alternative to the assembly shown in FIG. 3, the upper electrode 326 can also extend further to the outside, so that the same ends in an area above the electrode 332, which means extends to the portion of the dielectric 324 which is disposed on the $SiO_2$ layer on the layer 310. In that case, the layer 326 does preferably not extend to the edge of the dielectric 324.

In the following, a method for generating a capacitor assembly according to the present invention is described with reference to FIG. 3. FIG. 3 shows a contact electrode 332, which is deposited, in Damascene technique in a provided substrate 339. Then, the separation layer 310 in the form of a dielectric protection layer is deposited on the substrate 339 as well as the contact electrode 332. Then, the separation layer 310 is removed again at the location where an assembly of the capacitor assembly is provided. A first conductive auxiliary layer 322 is deposited on the exposed areas 340, 350. Then, the capacitor dielectric 324 is deposited on the first conductive auxiliary layer 322. Then, the second conductive auxiliary layer 326 is deposited within the effective capacitor area 340 on the capacitor dielectric 324. An etch stop layer 327 is deposited on the second conductive auxiliary layer 326, which is interrupted to enable a contact of the second conductive auxiliary layer 326 through a via hole.

FIG. 3a shows a modification of the embodiment shown in FIG. 3. Elements corresponding to the ones of FIG. 3 have the same reference numbers. Elements differing from the ones in FIG. 3 have the same reference numbers additionally provided with an "a". As can be seen, the assembly of contact electrode and second conductive auxiliary layer has been "inverted" compared to the assembly in FIG. 3. More specifically, the contact electrode 332a, different to FIG. 3, is not formed ring-shaped in the lower sheet 302, but disposed as a solid structure in an area (contact area 334a), which is adjacent to the window opening in the separation layer 310. Instead of the ring-shaped structure of the contact electrode, only the first conductive layer 326a and the etch stop layer 327a are formed ring-shaped in FIG. 3a, so that the contacting area 334a between the layer 322 and the contact electrode 332a overlaps with the effective capacitor area at most partly or not at all, so that at least part of the first conductive auxiliary layer 322 within the effective capacitor area is adjacent to the substrate 339 and not to the contact electrode 332a, respectively. As in FIG. 3, the overlapping area of the layers 322, 324 and 326a forms the effective capacitor area. Here, the contacting of the second conductive auxiliary layer 326a is performed by a ring-shaped via hole 336a.

Figure 4:
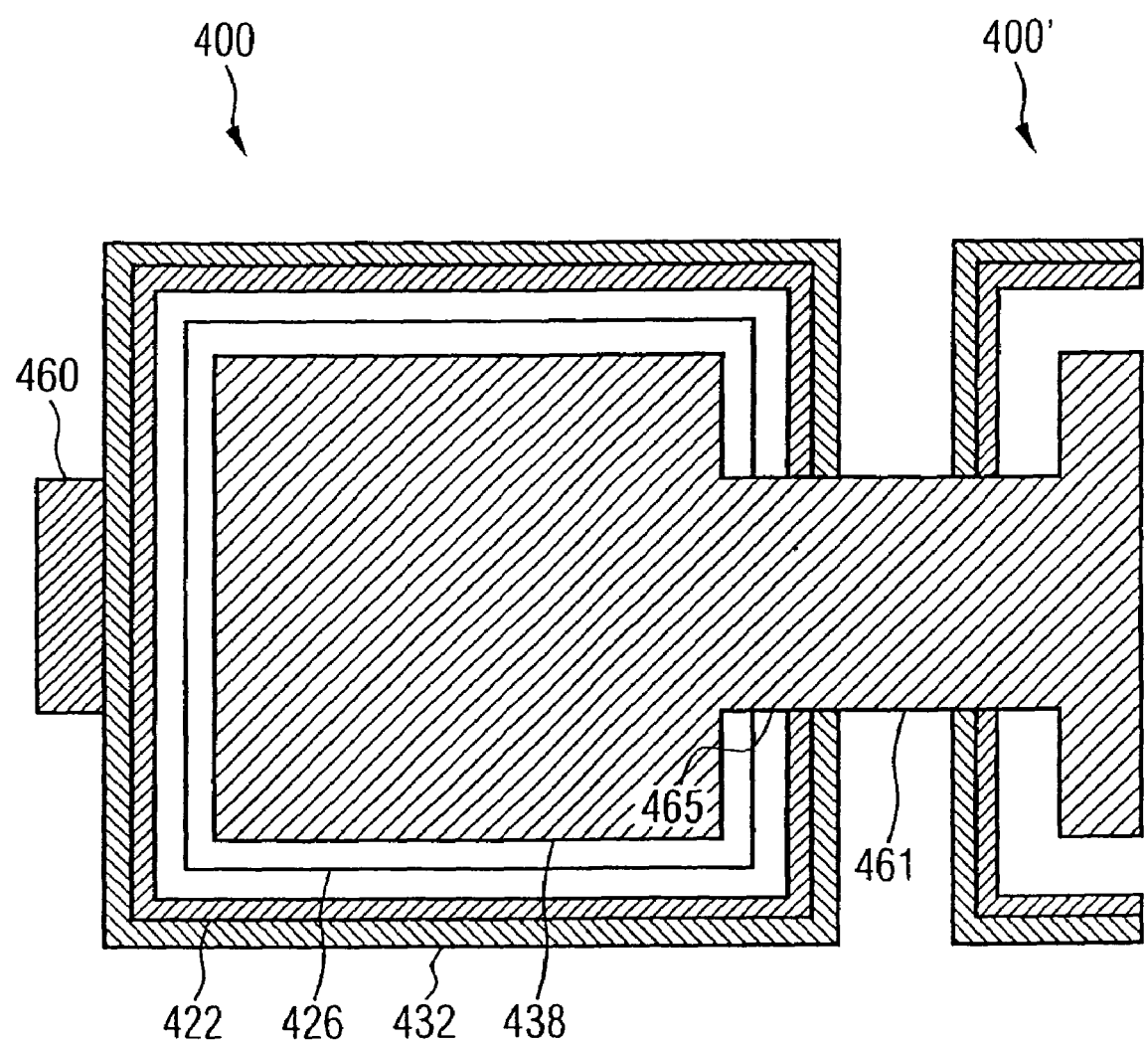
FIG. 4 is a schematic look-down representation of a capacitor assembly according a further preferred embodiment.
Figure 5:
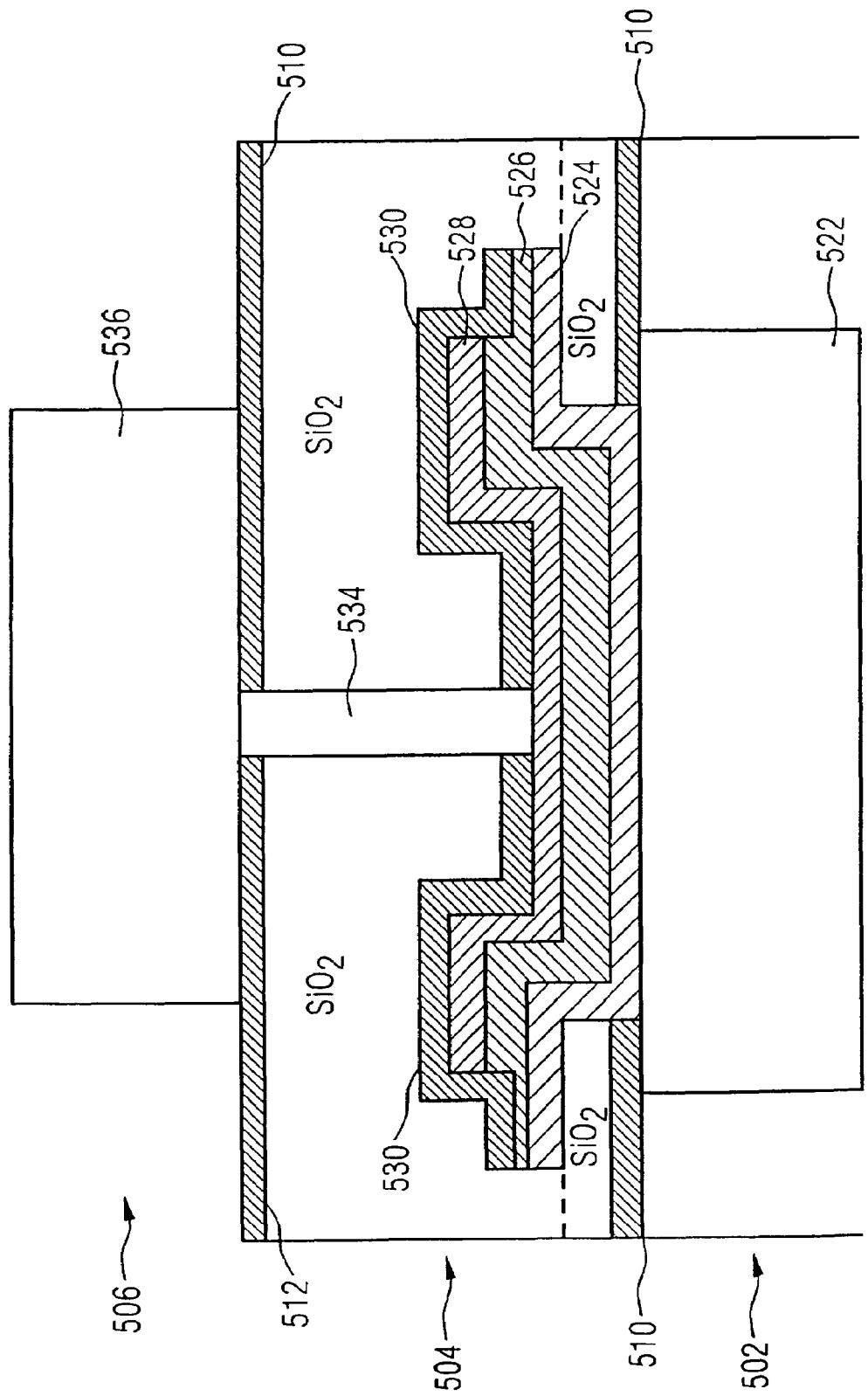
FIG. 5 is a schematic cross-sectional representation of a capacitor assembly according to the prior art.

FIG. 4 shows a purely schematical top-view representation of the capacitor assembly according to the present invention. A first capacitor assembly 400 is shown, which is connected to a second indicated capacitor assembly 400'. The first capacitor assembly 400 has a first conductive auxiliary layer 422 and a second conductive auxiliary layer 426. The first conductive auxiliary layer 422 overlaps partly with a contact electrode 432. A conductive trace 438 is connected to the second conductive auxiliary layer 426 through a via hole (not shown). The contact electrode 432 has connections 460, 461 in the form of conductive traces. Also, the conductive trace 438 has a connection 465 in the form of a conductive trace. The connection 465 connects the first capacitor assembly 400 to the second capacitor assembly 400'.

In FIG. 4, it can be seen that the contact electrode 432 encircles the first conductive auxiliary layer 422 and that the contact electrode 432 is outside an effective capacitor area, which is, in this embodiment, defined by the extension of the second conductive auxiliary layer 426.

Although preferred embodiments of the present invention have been discussed above in more detail, it is obvious that the present invention is not limited to those embodiments. Particularly, the described capacitor assembly is not limited to integrated circuits. Further, the described materials, dimensions and designs are chosen exemplarily.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A capacitor assembly, comprising:
   a substrate;
   a first conductive auxiliary layer on the substrate;
   a capacitor dielectric, which is connected to the first conductive auxiliary layer within a first boundary area between the capacitor dielectric and the first conductive auxiliary layer;
   a second conductive auxiliary layer which is connected to the capacitor dielectric within a second boundary area between the capacitor dielectric and the second conductive auxiliary layer, wherein an effective capacitor area is present where the first boundary area and the second boundary area overlap the dielectric; and
   a contact electrode for contacting the first conductive auxiliary layer in a contacting area, wherein the contacting area is disposed on a surface of the first conductive auxiliary layer opposing the first boundary area and overlaps with the effective capacitor area only partly or not at all, so that at least part of the first conductive auxiliary layer, which is within the effective capacitor area, is adjacent to the substrate or not adjacent to the contact electrode;
   wherein the contact electrode encircles or encloses in rectangular shape the effective capacitor area.

2. The capacitor assembly according to claim 1, wherein the first conductive auxiliary layer consists of a first material and the contact electrode of a second material, wherein the first conductive auxiliary layer and the contact electrode are produced in different process steps.

3. The capacitor assembly according to claim 1, wherein the contact electrode consists of a conductive material or a semiconductor material.

4. The capacitor assembly according to claim 1, wherein the first conductive auxiliary layer is a barrier layer, which forms a diffusion barrier between the contact electrode and the capacitor dielectric.

5. The capacitor assembly according to claim 1, wherein the contact electrode is part of a conductive trace disposed in the substrate.

6. The capacitor assembly according to claim 1, wherein the contacting area does not overlap with the effective capacitor area, and wherein the contacting area is disposed at a defined distance to the effective capacitor area.

7. The capacitor assembly according to claim 1, wherein the second conductive auxiliary layer is in contact with a via hole like the first conductive auxiliary layer.

* * * * *